(12) United States Patent
Fujie et al.

(10) Patent No.: US 7,838,184 B2
(45) Date of Patent: Nov. 23, 2010

(54) AZO DYE COMPOUND, COLORING COMPOSITION, INK SHEET FOR THERMAL TRANSFER RECORDING, THERMAL TRANSFER RECORDING METHOD, COLOR TONER, INK FOR INKJET, AND COLOR FILTER

(75) Inventors: Yoshihiko Fujie, Kanagawa (JP); Takashi Hoshimiya, Kanagawa (JP); Hisashi Mikoshiba, Kanagawa (JP); Naotsugu Muro, Kanagawa (JP)

(73) Assignee: Fujifilm Corporation, Tokyo (JP)

( * ) Notice: Subject to any disclaimer, the term of this patent is extended or adjusted under 35 U.S.C. 154(b) by 554 days.

(21) Appl. No.: 11/862,985

(22) Filed: Sep. 27, 2007

(65) Prior Publication Data

US 2008/0081279 A1 Apr. 3, 2008

(30) Foreign Application Priority Data

Sep. 29, 2006 (JP) ............................. 2006-267097

(51) Int. Cl.
 *G03F 7/004* (2006.01)
(52) U.S. Cl. ...................... 430/7; 430/108.23; 430/200; 8/692; 106/31.5; 347/100; 534/753
(58) Field of Classification Search ............. 430/7, 430/108.23; 8/692; 106/31.5; 347/100; 534/753
See application file for complete search history.

(56) References Cited

U.S. PATENT DOCUMENTS

| 4,764,178 A | 8/1988 | Gregory et al. |
| 5,079,213 A | 1/1992 | Chapman et al. |
| 7,141,657 B2 * | 11/2006 | Fujita et al. ............ 534/753 |
| 7,648,943 B2 * | 1/2010 | Fujiwara et al. ........... 503/227 |

FOREIGN PATENT DOCUMENTS

| JP | 2-207273 A | 8/1990 |
| JP | 2-207274 A | 8/1990 |
| JP | 3-276161 A | 12/1991 |
| JP | 4-265797 A | 9/1992 |

\* cited by examiner

*Primary Examiner*—John S Chu
(74) *Attorney, Agent, or Firm*—Sughrue Mion, PLLC

(57) ABSTRACT

An azo dye of the following formula:

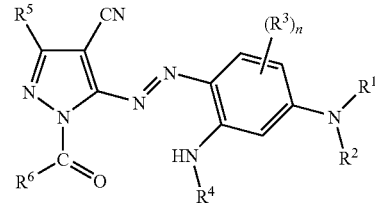

wherein $R^1$, $R^2$, $R^4$ and $R^5$ represent a hydrogen atom or a substituent; $R^3$ and $R^6$ each independently represent a substituent; n indicates 0 to 3. The dye has an excellent optical characteristic with sharp absorption and excellent fastness.

7 Claims, 1 Drawing Sheet

AZO DYE COMPOUND, COLORING COMPOSITION, INK SHEET FOR THERMAL TRANSFER RECORDING, THERMAL TRANSFER RECORDING METHOD, COLOR TONER, INK FOR INKJET, AND COLOR FILTER

BACKGROUND OF THE INVENTION

1. Field of the Invention

The present invention relates to a specific novel azo dye compound and a coloring composition containing the azo dye compound, as well as to a ink sheet for thermal transfer recording, a thermal transfer recording method, a color toner, an ink for inkjet and a color filter.

2. Description of the Related Art

Recently, the mainstream of an image-recording material is a material especially for forming color images; and concretely, a recording material for inkjet system, a recording material for thermal transfer system, a recording material for electrophotographic system, a silver halide photographic material for transfer system, a printing ink and a recording pen are much utilized. In a picture-taking element such as CCD in photographic instruments and in LCD or PDP in displays, used is a color filter for recording and reproducing color images.

In a color image-recording material and a color filter, used is a coloring agent of three primary colors (dyes, pigments) for reproducing and recording full-color images according to an additive color-mixing process or a subtractive color-mixing process. At present, however, no one knows a coloring agent that has an absorption characteristic capable of realizing a preferred color reproduction range and that is fast and durable under various working conditions, and improving it is greatly desired.

Thermal transfer recording includes a method of heating a thermal transfer material that has a hot-melt ink layer formed on a support (base film), with a thermal head to thereby melt the ink for recording on an image-receiving material; and a method of heating a thermal transfer material that has a thermal transfer dye-containing dye donor layer on a support, with a thermal head to thereby thermally diffuse and transfer the dye onto an image-receiving material. In the latter thermal transfer method, the amount of the dye to be transferred may be changed by changing the energy to be applied to the thermal head, and therefore the method facilitates gradation recording and is especially advantageous for full-color recording of high-quality images. However, the thermal transfer dye to be used in this method has many limitations, and there are known only an extremely few dyes satisfying all the necessary properties.

The necessary properties are, for example, the dye has a spectral characteristic favorable for color reproduction, it is easily transferable, it is fast to light and heat, it is fast to various chemicals, it is easy to produce, and it is easily processable to produce a thermal transfer recording material. However, conventional specific dyes that have been proposed to have a spectral characteristic favorable for color reproduction and to be fast to light and heat (for example, JP-A-1-225592, 63-189289) are not on a satisfactory level, and further improving them is greatly desired.

In electrophotographic color copiers and color laser printers, in general, widely used is a toner that comprises a coloring agent dispersed in resin particles. The necessary properties of color toner are an absorption characteristic capable of realizing a preferred color reproduction range, especially high transmittance (transparency) necessary for overhead projectors (hereinafter referred to as OHP), and various fastness under working conditions. Toners are proposed, comprising a coloring agent of pigment dispersed in particles (for example, JP-A-62-157051, JP-A-62-255956, JP-A-6-118715). These toners have excellent lightfastness, but easily aggregate as they are insoluble, therefore having problems in point of the transparency reduction and the transmitted color change. On the other hand, also proposed are toners comprising a coloring agent of a specific dye (for example, JP-A-3-276161, JP-A-2-207274, JP-A-2-207273). Contrary to the above, these toners have high transparency and have no color change, but have a problem in point of the lightfastness thereof.

An inkjet recording method has been greatly popularized these day and is being further developed, since its material cost is low, it enables high-speed recording, it makes few recording noises, and it facilitates color recording.

The inkjet recording method includes a continuous system where ink droplets are continuously jetted, and an on-demand system where ink droplets are jetted in accordance with an image information signal; and their jetting systems include a system where ink droplets are jetted out under pressure given thereto by a piezo element, a system where an ink is bubbled by heat and jetted out as droplets, an ultrasonic system, and a system of sucking in and jetting out ink droplets by electrostatic force. The ink for inkjet recording includes a water-base ink, an oil-base ink and a solid (hot-melt) ink.

The necessary properties of the coloring agent for use in the ink for such inkjet recording are that its solubility or dispersibility in solvent is good, it enables high-density recording, its color is good, it is fast to light, heat and active gases in the environment (oxidizing gases such as NOx, SOx, ozone), it is fast to water and chemicals, it well fixes in an image-receiving material with no bleeding, its storability in ink is good, it is not toxic, its purity is high, and it is inexpensive and is easily available. However, it is extremely difficult to obtain a coloring agent that satisfies these requirement on a high level. In particular, it is strongly desired that the coloring agent exhibits a good magenta color, its solubility is high, and it is fast to light, moisture and heat, especially highly fast to light.

Since a color filter is required to have high transparency, a coloring method of dyeing it with a dye has heretofore been employed. For example, a colorable photoresist is patternwise exposed to light and developed to form a pattern, and then this is dyed with a dye of a filter color. This method is repeated for all the filter colors, thereby producing a color filter. Apart form the coloring method, also employable is a method of using a positive resist for color filter production. The color filter produced according to these methods have high transmittance as comprising dyes, and its optical characteristic is good, but its lightfastness and heat resistance are limited. Accordingly, a coloring agent excellent in various resistance and having high transparency is desired. On the other hand, a method of using an organic pigment having excellent lightfastness and heat resistance in place of dye is widely known, but color filters with pigment could hardly have an optical characteristic like those with dye.

Common to them, dyes usable to the above-mentioned applications are desired to have the following properties. Specifically, they exhibit good color in color reproduction, they have an optimum spectral absorption, they have good fastness such as lightfastness, moisture resistance, chemical resistance, and their solubility is high.

A dye having a specific pyrazolylazoaniline skeleton has been proposed for use in thermal transfer recording (for example, U.S. Pat. No. 4,764,178, JP-A-4-265797). However, the dye is not on a satisfactory level in point of the above-mentioned necessary characteristics, and is desired to be further investigated.

SUMMARY OF THE INVENTION

An object of the invention is to provide a novel azo dye compound having an excellent optical characteristic with sharp absorption and having excellent fastness, and to provide an ink sheet for thermal transfer recording that contains the azo dye compound, and a thermal transfer recording method with it. In particular, another object of the invention is to provide an ink sheet for thermal transfer recording that satisfies all the requirements of excellent color reproducibility, image storability and transfer sensitivity in printing samples, and a thermal transfer recording method with it. Still other object of the invention is to provide a color toner, a inkjet ink and a color filter comprising the azo dye compound.

The present inventors have assiduously studied and, as a result, have found that the above objects can be attained by the following constitutions.

(1) An azo dye represented by the following formula (1):

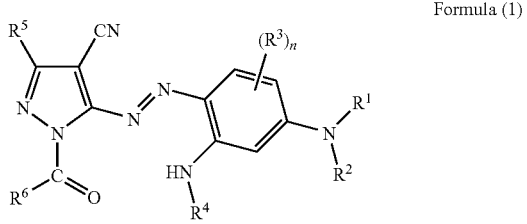

Formula (1)

wherein $R^1$, $R^2$, $R^4$ and $R^5$ each independently represent a hydrogen atom or a substituent; $R^3$ and $R^6$ each independently represent a substituent; n indicates an integer of from 0 to 3; when n is 2 or more, then plural $R^3$'s may be the same or different; $R^1$ and $R^2$ may bond to each other to form a ring structure.

(2) A coloring composition comprising the azo dye compound of (1).

(3) An ink sheet for thermal transfer recording, comprising the azo dye compound of (1).

(4) A thermal transfer recording method comprising forming an image on an image-receiving material comprising a polymer-containing ink-receiving layer on a support by use of the ink sheet for thermal transfer recording of (3).

(5) A color toner comprising the azo dye compound of (1).

(6) An inkjet ink comprising the azo dye compound of (1).

(7) A color filter comprising the azo dye compound of (1).

According to the invention, there are provided a novel azo dye compound satisfying all the requirements of excellent optical characteristic with sharp absorption, and excellent fastness and transfer sensitivity, an ink sheet for thermal transfer recording that contains the azo dye compound, and a thermal transfer recording method with it. Unexpectedly, the novel azo dye compound has excellent solubility in solvent and may greatly reduce the working load and the environmental load in ink sheet formation. In particular, there are provided an ink sheet for thermal transfer recording that satisfies all the requirements of excellent color reproducibility, image storability and transfer sensitivity in printing samples, and a thermal transfer recording method with it. Further, there are also provided a color toner, a inkjet ink and a color filter comprising the azo dye compound.

BEST MODE FOR CARRYING OUT THE INVENTION

Figure 1:
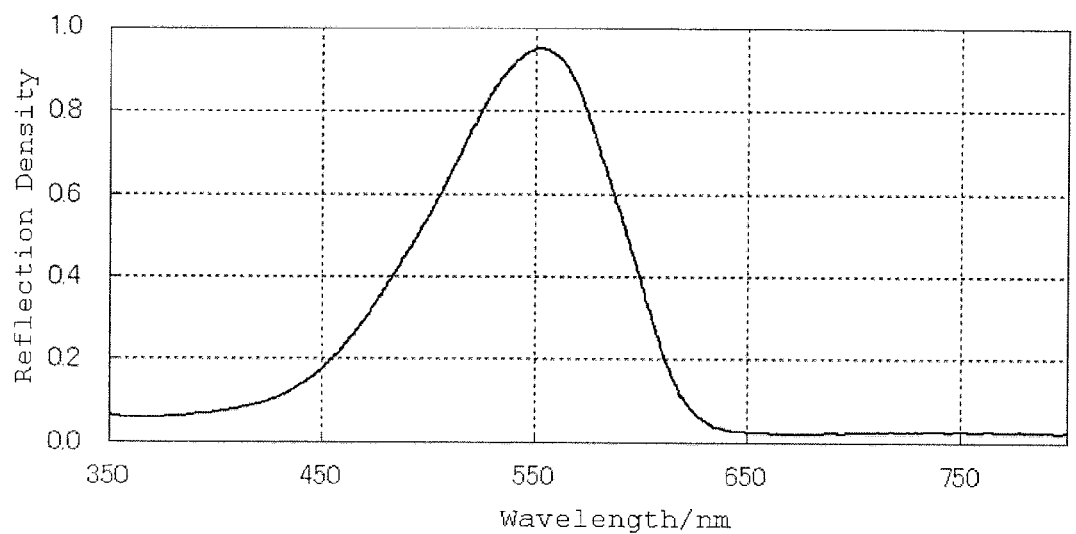
FIG. 1 is a reflection spectrum of the image formed in inkjet recording in Example 4.

The ink sheet for thermal transfer recording, the color toner, the inkjet ink and the color filter, and the azo dye compound for use in them of the invention are described in detail hereinunder.

The description of the constitutive elements of the invention given hereinunder is for some typical embodiments of the invention, to which, however, the invention should not be limited. In this description, the numerical range expressed by the wording "a number to another number" means the range that falls between the former number indicating the lowermost limit of the range and the latter number indicating the uppermost limit thereof.

[Azo Dye Compound of Formula (1)]

First, the azo dye compound of formula (1) of the invention is described in detail.

The azo dye compound (pyrazolylazoaniline dye compound) of formula (1) is a dye compound characterized by having a carbonyl group introduced thereinto as the 1-positioned substituent of pyrazole. Up to the present, the azo dye compound having such a characteristic structure is not known at all. As compared with a dye compound having a hydrogen atom or an alkyl group as the 1-positioned substituent of pyrazole, the azo dye compound of formula (1) has overwhelmingly excellent lightfastness. This may be because the oxygen atom of the carbonyl group and the nitrogen atom of the azo group may bond to the hydrogen atom on the amino group in the coupler moiety in a mode of crosslinking hydrogen bonding between them, thereby capable of efficiently inactivating the exciting energy of the compound.

Since the azo dye compound of formula (1) has excellent solubility and lightfastness, it is favorable for use in an ink sheet for thermal transfer recording, and in addition, it may also be favorably used in any other applications (for example, in ink).

In formula (1), $R^1$, $R^2$ and $R^4$ each independently represent a hydrogen atom or a substituent.

Not specifically defined, the substituent typically includes an aliphatic group (e.g., an alkyl group, an alkenyl group, an alkynyl group), an aryl group, a heterocyclic group, an acyl group, an aryloxycarbonyl group, an aliphatic oxycarbonyl group (e.g., an alkoxycarbonyl group) and a carbamoyl group, and these groups may be further substituted. The substituent for them is separately described hereinunder.

$R^1$ and $R^2$ may bond to each other to form a ring structure. Preferably, the ring structure is a 5- to 7-membered ring structure, more preferably a 5- or 6-membered ring structure. Examples of the ring structure formed by $R^1$ and $R^2$ and the nitrogen atom to which they bond are a pyrrolidine ring, a piperidine ring, and a morpholine ring. Preferred is a piperidine or morpholine ring.

In formula (1), $R^3$ represents a substituent, and $R^5$ represents a hydrogen atom or a substituent. Not specifically defined, the substituent for $R^3$ and $R^5$ typically includes a halogen atom, an aliphatic group [a saturated aliphatic group (this means an alkyl group, or a cyclic saturated aliphatic group including a cycloalkyl group, a bicycloalkyl group, a crosslinked cyclic saturated hydrocarbon group or a spiro-saturated hydrocarbon group), an unsaturated aliphatic group (this means a linear unsaturated aliphatic group such as an alkenyl group or an alkynyl group, or a cyclic unsaturated aliphatic group including a cycloalkenyl group, a bicycloalkenyl group, a crosslinked cyclic unsaturated hydrocarbon group and a spiro-unsaturated hydrocarbon group, having a double bond or a triple bond)], an aryl group (preferably a phenyl group optionally having a substituent), a heterocyclic group (preferably a 5- to 8-membered ring containing an oxygen atom, a sulfur atom or a nitrogen atom as the ring-constituting atom, and this may be condensed with an alicyclic ring, an aromatic ring or a hetero ring), a cyano group, an aliphatic oxy group (typically an alkoxy group), an aryloxy group, an acyloxy group, a carbamoyloxy group, an aliphatic oxycarbonyl group (typically an alkoxycarbonyloxy group, an aryloxycarbonyloxy group), an amino group [including an aliphatic amino group (typically an alkylamino group), an anilino group, and a heterocyclic amino group], an acylamino group, an aminocarbonylamino group, an aliphatic oxycarbonylamino group (typically an alkoxycarbonylamino group), an aryloxycarbonylamino group, a sulfamoylamino group, an aliphatic (typically alkyl) or arylsulfonylamino group, an aliphatic thio group (typically an alkylthio group), an arylthio group, a sulfamoyl group, an aliphatic (typically alkyl) or arylsulfinyl group, an aliphatic (typically alkyl) or arylsulfonyl group, an acyl group, an aryloxycarbonyl group, an aliphatic oxycarbonyl group (typically an alkoxycarbonyl group), a carbamoyl group, an aryl or heterocyclic azo group, an imido group, an aliphatic oxysulfonyl group (typically an alkoxysulfonyl group), an aryloxysulfonyl group, a halogen atom, a hydroxyl group, a nitro group, a carboxyl group, and a sulfo group; and these groups may be further substituted (for example, with the substituent mentioned hereinabove for $R^3$).

In formula (1), $R^6$ represents a substituent. Not specifically defined, the substituent typically includes those mentioned hereinabove for $R^3$, especially including an aliphatic group (typically an alkyl group, an alkenyl group, an alkynyl group, a cycloalkyl group, a cycloalkenyl group), an aryl group, a heterocyclic group, an aliphatic oxy group (typically an alkoxy group), an aryloxy group, an acyloxy group, an amino group [including an aliphatic amino group (typically an alkylamino group), an anilino group and a heterocyclic amino group], an acylamino group, an aminocarbonylamino group, an aliphatic oxycarbonylamino group (typically an alkoxycarbonylamino group), an aryloxycarbonylamino group, a sulfamoylamino group, an aliphatic (typically alkyl) or arylsulfonylamino group, and an aliphatic thio group (typically an alkylthio group); and these groups may be further substituted (for example, with the substituent mentioned hereinabove for $R^3$).

In formula (1), n indicates an integer of from 0 to 3. When n is 2 or more, then plural $R^3$'s may be the same or different.

The substituents for the above $R^1$ to $R^6$, and those with which the groups may be substituted are described in detail hereinunder.

The halogen atom includes a fluorine atom, a chlorine atom, a bromine atom, and an iodine atom. Of those, preferred are a chlorine atom and a bromine atom; and more preferred is a chlorine atom.

The aliphatic group is a linear, branched or cyclic aliphatic group. As so mentioned in the above, the saturated aliphatic group includes an alkyl group, a cycloalkyl group and a bicycloalkyl group, which may be substituted. Preferably, the group has from 1 to 30 carbon atoms. Its examples are a methyl group, an ethyl group, an n-propyl group, an isopropyl group, a tert-butyl group, an n-octyl group, an eicosyl group, a 2-chloroethyl group, a 2-cyanoethyl group, a benzyl group, and a 2-ethylhexyl group. The cycloalkyl group includes a substituted or unsubstituted cycloalkyl group. The substituted or unsubstituted cycloalkyl group is preferably a cycloalkyl group having from 3 to 30 carbon atoms. Its examples are a cyclohexyl group, a cyclopentyl group, and a 4-n-dodecylcyclohexyl group. The bicycloalkyl group may be a substituted or unsubstituted bicycloalkyl group having from 5 to 30 carbon atoms, or that is, a monovalent group derived from a bicycloalkane having from 5 to 30 carbon atoms by removing one hydrogen atom from it. Its examples are a bicyclo[1,2,2]heptan-2-yl group, and a bicyclo[2,2,2]octan-3-yl group. The aliphatic group may further include tricyclic or more multicyclic structures.

The unsaturated aliphatic group is a linear, branched or cyclic unsaturated aliphatic group, including an alkenyl group, a cycloalkenyl group, a bicycloalkenyl group, and an alkynyl group. The alkenyl group is a linear, branched or cyclic, substituted or unsubstituted alkenyl group. The alkenyl group is preferably a substituted or unsubstituted alkenyl group having from 2 to 30 carbon atoms. Its examples are a vinyl group, an allyl group, a prenyl group, a geranyl group, an oleyl group. The cycloalkenyl group is preferably a substituted or unsubstituted cycloalkenyl group having from 3 to 30 carbon atoms, or that is, a monovalent group derived from a cycloalkene having from 3 to 30 carbon atoms by removing one hydrogen atom from it. Its examples are a 2-cyclopenten-1-yl group, a 2-cyclohexen-1-yl group. The bicycloalkenyl group is preferably a bicycloalkenyl group having from 5 to 30 carbon atoms, or that is, a monovalent group derived from a bicycloalkene having one double bond, by removing one hydrogen atom from it. Its examples are a bicyclo[2.2.1]hept-2-en-1-yl group, a bicyclo[2.2.2]oct-2-en-4-yl group. The alkynyl group is preferably a substituted or unsubstituted alkynyl group having from 2 to 30 carbon atoms, including, for example, an ethynyl group and a propargyl group.

The aryl group is preferably a substituted or unsubstituted aryl group having from 6 to 30 carbon atoms, for example, including a phenyl group, a p-tolyl group, a naphthyl group, an m-chlorophenyl group, an o-hexadecanoylaminophenyl group. More preferred is a phenyl group optionally having a substituent.

The heterocyclic group is a monovalent group derived from a substituted or unsubstituted aromatic or non-aromatic heterocyclic compound, by removing one hydrogen atom from it, and it may be condensed with any other ring. The heterocyclic group is preferably a 5- or 6-membered heterocyclic group, in which the ring-constituting hetero atom preferably includes an oxygen atom, a sulfur atom and a nitrogen atom. More preferably, it is a 5- or 6-membered aromatic heterocyclic group having from 3 to 30 carbon atoms. The hetero ring of the heterocyclic group includes a pyridine ring, a pyrazine ring, a pyridazine ring, a pyrimidine ring, a triazine ring, a quinoline ring, an isoquinoline ring, a quinazoline ring, a cinnoline ring, a phthalazine ring, a quinoxaline ring, a pyrrole ring, an indole ring, a furan ring, a benzofuran ring, a thiophene ring, a benzothiophene ring, a pyrazole ring, an imidazole ring, a benzimidazole ring, a triazole ring, an oxazole ring, a benzoxazole ring, a thiazole ring, a benzothiazole ring, an isothiazole ring, a benzisothiazole ring, a thiadiazole ring, an isoxazole ring, a benzisoxazole ring, a pyrrolidine ring, a piperidine ring, a piperazine ring, an imidazolidine ring, a thiazoline ring.

The aliphatic oxy group (typically an alkoxy group) includes a substituted or unsubstituted aliphatic oxy group (typically alkoxy group), preferably having from 1 to 30 carbon atoms. For example, it includes a methoxy group, an ethoxy group, an isopropoxy group, an n-octyloxy group, a methoxyethoxy group, a hydroxyethoxy group and a 3-carboxypropoxy group.

The aryloxy group is preferably a substituted or unsubstituted aryloxy group having from 6 to 30 carbon atoms. Examples of the aryloxy group are a phenoxy group, a 2-methylphenoxy group, a 4-tert-butylphenoxy group, a 3-nitrophenoxy group, a 2-tetradecanoylaminophenoxy group. Preferred is a phenyloxy group optionally having a substituent.

The acyloxy group is preferably a formyloxy group, a substituted or unsubstituted alkylcarbonyloxy group having from 2 to 30 carbon atoms, a substituted or unsubstituted arylcarbonyloxy group having from 6 to 30 carbon atoms. Examples of the acyloxy group are a formyloxy group, an acetyloxy group, a pivaloyloxy group, a stearoyloxy group, a benzoyloxy group, a p-methoxyphenylcarbonyloxy group.

The carbamoyloxy group is preferably a substituted or unsubstituted carbamoyloxy group having from 1 to 30 carbon atoms. Examples of the carbamoyloxy group are an N,N-dimethylcarbamoyloxy group, an N,N-diethylcarbamoyloxy group, a morpholinocarbonyloxy group, an N,N-di-n-octylaminocarbonyloxy group, an N-n-octylcarbamoyloxy group.

The aliphatic oxycarbonyl group (typically an alkoxycarbonyloxy group) preferably has from 2 to 30 carbon atoms, and may have a substituent. For example, it includes a methoxycarbonyloxy group, an ethoxycarbonyloxy group, a tert-butoxycarbonyloxy group, an n-octylcarbonyloxy group.

The aryloxycarbonyloxy group is preferably a substituted or unsubstituted aryloxycarbonyloxy group having from 7 to 30 carbon atoms. Examples of the aryloxycarbonyloxy group are a phenoxycarbonyloxy group, a p-methoxyphenoxycarbonyloxy group, a p-n-hexadecyloxyphenoxycarbonyloxy group. Preferred is a phenoxycarbonyloxy group optionally having a substituent.

The amino group includes an aliphatic amino group (typically an alkylamino group), an arylamino group and a heterocyclic amino group. The amino group is preferably a substituted or unsubstituted aliphatic amino group having from 1 to 30 carbon atoms (typically including an alkylamino group), or a substituted or unsubstituted arylamino group having from 6 to 30 carbon atoms. Examples of the amino group are, for example, an amino group, a methylamino group, a dimethylamino group, an anilino group, an N-methyl-anilino group, a diphenylamino group, a hydroxyethylamino group, a carboxyethylamino group, a sulfoethylamino group, a 3,5-dicarboxyanilino group, a 4-quinolylamino group.

The acylamino group is preferably a formylamino group, a substituted or unsubstituted alkylcarbonylamino group having from 1 to 30 carbon atoms, or a substituted or unsubstituted arylcarbonylamino group having from 6 to 30 carbon atoms. Examples of the acylamino group are a formylamino group, an acetylamino group, a pivaloylamino group, a lauroylamino group, a benzoylamino group, a 3,4,5-tri-n-octyloxyphenylcarbonylamino group.

The aminocarbonylamino group is preferably a substituted or unsubstituted aminocarbonylamino group having from 1 to 30 carbon atoms. Examples of the aminocarbonylamino group are a carbamoylamino group, an N,N-dimethylaminocarbonylamino group, an N,N-diethylaminocarbonylamino group, a morpholinocarbonylamino group. The term "amino" of this group has the same meaning as that of "amino" of the above-mentioned amino group.

The aliphatic oxycarbonylamino group (typically an alkoxycarbonylamino group) preferably has from 2 to 30 carbon atoms, and may have a substituent. For example, it includes a methoxycarbonylamino group, an ethoxycarbonylamino group, a tert-butoxycarbonylamino group, an n-octadecyloxycarbonylamino group, an N-methyl-methoxycarbonylamino group.

The aryloxycarbonylamino group is preferably a substituted or unsubstituted aryloxycarbonylamino group having from 7 to 30 carbon atoms. Examples of the aryloxycarbonylamino group are a phenoxycarbonylamino group, a p-chlorophenoxycarbonylamino group, an m-n-octyloxyphenoxycarbonylamino group. Preferred is a phenyloxycarbonylamino group optionally having a substituent.

The sulfamoylamino group is preferably a substituted or unsubstituted sulfamoylamino group having from 0 to 30 carbon atoms. Examples of the sulfamoylamino group are a sulfamoylamino group, an N,N-dimethylaminosulfonylamino group, an N-n-octylaminosulfonylamino group.

The aliphatic (typically alkyl) or arylsulfonylamino group is preferably a substituted or unsubstituted aliphatic sulfonylamino group having from 1 to 30 carbon atoms (typically an alkylsulfonylamino group), or a substituted or unsubstituted arylsulfonylamino group having from 6 to 30 carbon atoms (preferably a phenylsulfonylamino group optionally having a substituent). For example, it includes a methylsulfonylamino group, a butylsulfonylamino group, a phenylsulfonylamino group, a 2,3,5-trichlorophenylsulfonylamino group, a p-methylphenylsulfonylamino group.

The aliphatic thio group (typically an alkylthio group) is preferably a substituted or unsubstituted alkylthio group having from 1 to 30 carbon atoms. Examples of the alkylthio group are a methylthio group, an ethylthio group, an n-hexadecylthio group.

The sulfamoyl group is preferably a substituted or unsubstituted sulfamoyl group having from 0 to 30 carbon atoms. Examples of the sulfamoyl group are an N-ethylsulfamoyl group, an N-(3-dodecyloxypropyl)sulfamoyl group, an N,N-dimethylsulfamoyl group, an N-acetylsulfamoyl group, an N-benzoylsulfamoyl group, an N-(N'-phenylcarbamoyl) sulfamoyl group.

The aliphatic (typically alkyl) or arylsulfinyl group is preferably a substituted or unsubstituted aliphatic sulfinyl group having from 1 to 30 carbon atoms (typically an alkylsulfinyl group), or a substituted or unsubstituted arylsulfinyl group having from 6 to 30 carbon atoms (preferably a phenylsulfinyl group optionally having a substituent). For example, it includes a methylsulfinyl group, an ethylsulfinyl group, a phenylsulfinyl group, a p-methylphenylsulfinyl group.

The aliphatic (typically alkyl) or arylsulfonyl group is preferably a substituted or unsubstituted aliphatic sulfonyl group having from 1 to 30 carbon atoms (typically an alkylsulfonyl group), or a substituted or unsubstituted arylsulfonyl group having from 6 to 30 carbon atoms (preferably a phenylsulfonyl group optionally having a substituent). For example, it includes a methylsulfonyl group, an ethylsulfonyl group, a phenylsulfonyl group, a p-toluenesulfonyl group.

The acyl group is preferably a formyl group, a substituted or unsubstituted aliphatic carbonyl group having from 2 to 30 carbon atoms (typically an alkylcarbonyl group), a substituted or unsubstituted arylcarbonyl group having from 7 to 30 carbon atoms (preferably a phenylcarbonyl group optionally having a substituent), or a substituted or unsubstituted heterocyclic carbonyl group having from 4 to 30 carbon atoms and bonding to the carbonyl group via the carbon atom. For example, it includes an acetyl group, a pivaloyl group, a 2-chloroacetyl group, a stearoyl group, a benzoyl group, a p-n-octyloxyphenylcarbonyl group, a 2-pyridylcarbonyl group, a 2-furylcarbonyl group.

The aryloxycarbonyl group is preferably a substituted or unsubstituted aryloxycarbonyl group having from 7 to 30 carbon atoms. Examples of the aryloxycarbonyl group are a phenoxycarbonyl group, an o-chlorophenoxycarbonyl group, an m-nitrophenoxycarbonyl group, a p-tert-butylphenoxycarbonyl group. Preferred is a phenyloxycarbonyl group optionally having a substituent.

The aliphatic oxycarbonyl group (typically an alkoxycarbonyl group) preferably has from 2 to 30 carbon atoms, and may have a substituent. For example, it includes a methoxycarbonyl group, an ethoxycarbonyl group, a tert-butoxycarbonyl group, an n-octadecyloxycarbonyl group.

The carbamoyl group is preferably a substituted or unsubstituted carbamoyl group having from 1 to 30 carbon atoms. Examples of the carbamoyl group are a carbamoyl group, an N-methylcarbamoyl group, an N,N-dimethylcarbamoyl group, an N,N-di-n-octylcarbamoyl group, an N-(methylsulfonyl)carbamoyl group.

The aryl or heterocyclic azo group includes, for example, a phenylazo group, a 4-methoxyphenylazo group, a 4-pivaloylaminophenylazo group, a 2-hydroxy-4-propanoylphenylazo group.

The imido group includes, for example, an N-succinimido group, an N-phthalimido group.

In addition to the above, the substituent further includes a hydroxyl group, a cyano group, a nitro group, a sulfo group, a carboxyl group.

These groups may be further substituted, for which the substituents may include those mentioned hereinabove.

Preferably, $R^1$ and $R^2$ are each independently a substituted or unsubstituted aliphatic group having from 1 to 20 carbon atoms (preferably an alkyl group, an alkenyl group, a cycloalkyl group, more preferably an alkyl group), a substituted or unsubstituted aryl group (preferably a phenyl group optionally having a substituent), a substituted or unsubstituted heterocyclic group; more preferably a substituted or unsubstituted aliphatic group having from 1 to 10 carbon atoms (preferably an alkyl group, an alkenyl group, a cycloalkyl group, more preferably an alkyl group), or a substituted or unsubstituted aryl group; most preferably an unsubstituted alkyl group having from 1 to 4 carbon atoms.

$R^3$ is preferably a substituted or unsubstituted aliphatic group having from 1 to 10 carbon atoms (preferably an alkyl group, an alkenyl group, a cycloalkyl group; more preferably an alkyl group), a substituted or unsubstituted aryl group (preferably a phenyl group optionally having a substituent), a substituted or unsubstituted aliphatic oxy group having from 1 to 10 carbon atoms (preferably an alkoxy group, an alkenoxy group, a cycloalkoxy group; more preferably an alkoxy group); more preferably a substituted or unsubstituted alkyl group having from 1 to 5 carbon atoms, a substituted or unsubstituted alkoxy group having from 1 to 5 carbon atoms; most preferably an unsubstituted alkoxy group having from 1 to 3 carbon atoms.

$R^4$ is preferably a substituted or unsubstituted aliphatic group having from 1 to 20 carbon atoms (preferably an alkyl group, an alkenyl group, a cycloalkyl group; more preferably an alkyl group), a substituted or unsubstituted aryl group, a substituted or unsubstituted acyl group having from 1 to 10 carbon atoms, a substituted or unsubstituted aliphatic oxycarbonyl group having from 1 to 10 carbon atoms (preferably an alkoxycarbonyl group, an alkenoxycarbonyl group, a cycloalkoxycarbonyl group, a cycloalkenoxycarbonyl group; more preferably an alkoxycarbonyl group), a substituted or unsubstituted di-aliphatic alkylaminocarbonyl group having from 1 to 20 carbon atoms (preferably a dialkylaminocarbonyl group, a dialkenylaminocarbonyl group, an N-alkyl-N-alkenylaminocarbonyl group; more preferably a dialkylaminocarbonyl group); more preferably a substituted or unsubstituted aliphatic group having from 1 to 10 carbon atoms (preferably an alkyl group, an alkenyl group, a cycloalkyl group; more preferably an alkyl group), a substituted or unsubstituted aryl group, a substituted or unsubstituted acyl group having from 1 to 8 carbon atoms; most preferably an unsubstituted acyl group having from 1 to 4 carbon atoms.

$R^5$ is preferably a substituted or unsubstituted aliphatic group having from 1 to 20 carbon atoms (preferably an alkyl group, an alkenyl group, a cycloalkyl group; more preferably an alkyl group), a substituted or unsubstituted aryl group (preferably a phenyl group optionally having a substituted); more preferably a substituted or unsubstituted aliphatic group having from 3 to 10 carbon atoms (preferably an alkyl group, an alkenyl group, a cycloalkyl group; more preferably an alkyl group); most preferably a tert-butyl group.

$R^6$ is preferably a substituted or unsubstituted aliphatic group having from 1 to 20 carbon atoms (preferably an alkyl group, an alkenyl group, a cycloalkyl group; more preferably an alkyl group), a di-aliphatic alkylaminocarbonyl group having from 2 to 10 carbon atoms (preferably a dialkylaminocarbonyl group, a dialkenylaminocarbonyl group, an N-alkyl-N-alkenylaminocarbonyl group; more preferably a dialkylaminocarbonyl group); a substituted or unsubstituted aliphatic oxy group having from 1 to 10 carbon atoms (preferably an alkoxy group, an alkenoxy group, a cycloalkoxy group; more preferably an alkoxy group), a substituted or unsubstituted aryl group (preferably a phenyl group optionally having a substituent); more preferably a substituted or unsubstituted aliphatic group having from 1 to 10 carbon atoms (preferably an alkyl group, an alkenyl group, a cycloalkyl group; more preferably an alkyl group), a substituted or unsubstituted aryl group, a substituted or unsubstituted alkoxy group having from 1 to 5 carbon atoms; most preferably a substituted or unsubstituted alkyl group having from 1 to 4 carbon atoms, a substituted or unsubstituted aryl group.

n is preferably from 0 to 2, more preferably from 0 to 1, most preferably 0.

Regarding preferred combinations of the substituents (combinations of $R^1$ to $R^6$) of the dye compound of formula (1) of the invention, preferred are the compounds where at least one of these substituents is the above-mentioned preferred group; more preferred are those where a larger number of the substituents are the preferred groups; most preferred are those where all the substituents are the preferred groups.

A preferred combination is as follows: $R^1$ is a substituted or unsubstituted alkyl group having from 1 to 4 carbon atoms, $R^2$ is a substituted or unsubstituted alkyl group having from 1 to 4 carbon atoms, $R^4$ is an acyl group, $R^5$ is a substituted or unsubstituted alkyl group having from 1 to 4 carbon atoms, $R^6$ is a substituted or unsubstituted alkyl group having from 1 to 4 carbon atoms, a dialkylamino group having from 2 to 10 carbon atoms, a substituted or unsubstituted alkoxy group, a substituted or unsubstituted aryl group, and n=0.

A more preferred combination is as follows: $R^1$ is a substituted or unsubstituted alkyl group having from 1 to 4 carbon atoms, $R^2$ is a substituted or unsubstituted alkyl group having from 1 to 4 carbon atoms, $R^4$ is an acyl group, $R^5$ is a tert-butyl group, $R^6$ is a substituted or unsubstituted alkyl group having from 1 to 4 carbon atoms, a dialkylamino group having from 2 to 10 carbon atoms, a substituted or unsubstituted alkoxy group, a substituted or unsubstituted aryl group, and n=0.

A most preferred combination is as follows: $R^1$ is a substituted or unsubstituted alkyl group having from 1 to 4 carbon atoms, $R^2$ is a substituted or unsubstituted alkyl group having from 1 to 4 carbon atoms, $R^4$ is an acyl group, $R^5$ is a tert-butyl group, $R^6$ is a substituted or unsubstituted alkyl group having from 1 to 4 carbon atoms, a substituted or unsubstituted alkoxy group, a substituted or unsubstituted aryl group, and n=0.

From the viewpoint of its thermal diffusibility, the molecular weight of the dye compound of formula (1) is preferably at most 500, more preferably at most 450.

Examples of the azo dye compound of formula (1) of the invention are shown below, by which, however, the azo dye compound of formula (1) of the invention should not be limitatively interpreted. In the following examples, Ph means a phenyl group ($—C_6H_5$).

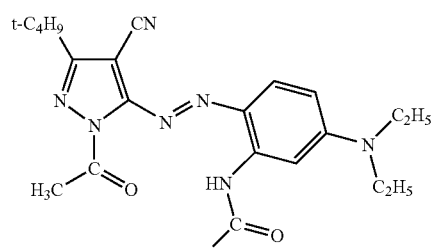
(1)

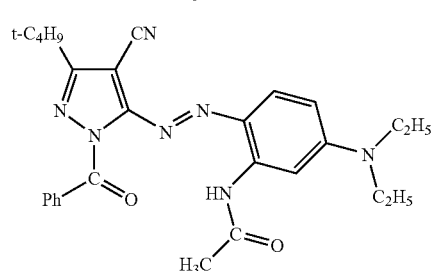
(2)

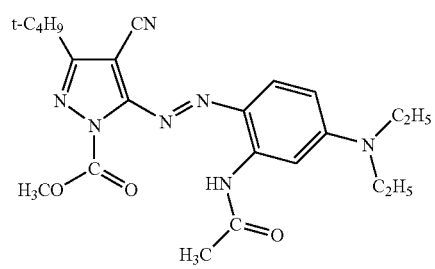
(3)

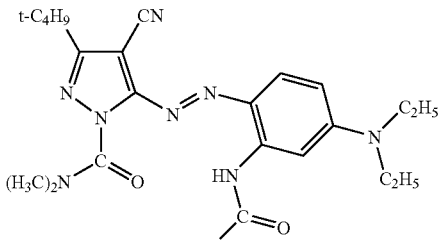
(4)

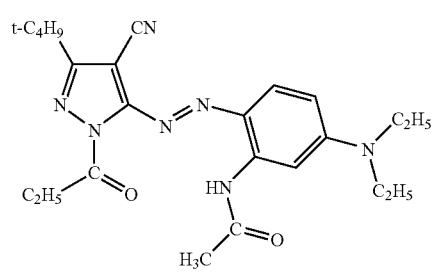
(5)

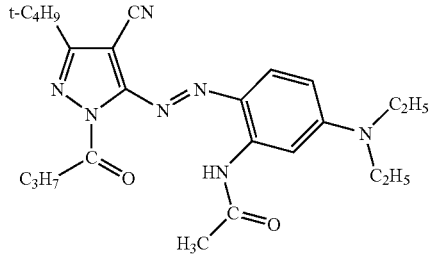
(6)

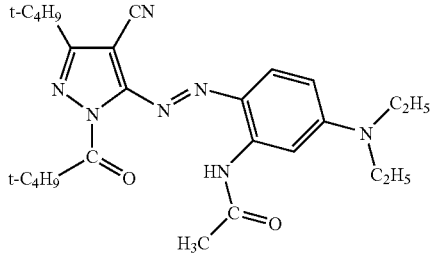
(7)

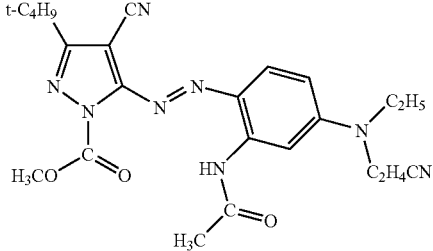
(8)

These azo compound may be produced through ordinary diazo coupling followed by acylation with an acid chloride.

Concretely, an aminopyrazole derivative of the following formula (2) is processed with a diazoation reagent at the amino group thereof, and converted into a diazonium salt of the following formula (3), and then the diazonium salt is reacted for coupling with an aniline derivative of the following formula (4) to obtain a compound of the following formula (5). Next, the compound of formula (5) is acylated with a compound of the following formula (6) under a basic condition, and the process readily gives the intended azo dye compound. This is concretely demonstrated in Examples given hereinunder.

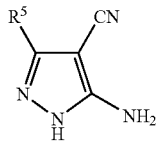

Formula (2)

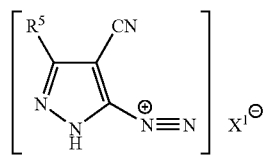

Formula (3)

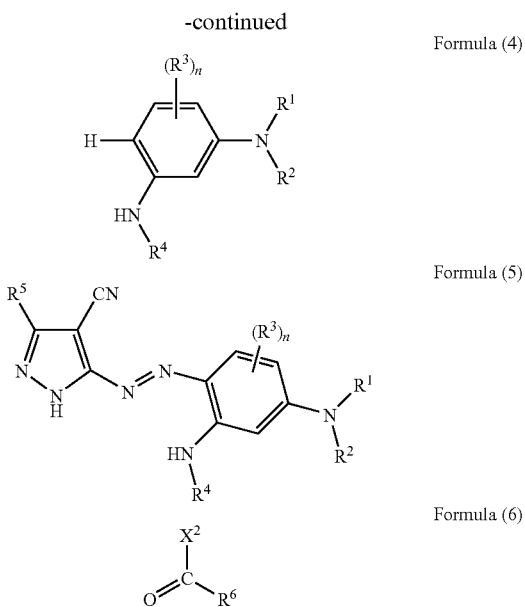

In the formulae, $R^1$ to $R^6$ have the same meanings as those in formula (1); $X^1$ represents a counter anion of the diazonium salt of formula (3); $X^2$ represents a halogen atom.

Many of the compounds of formulae (4) and (6) are readily available as commercial products (for example, Wako Pure Chemical Industry's catalogue Nos. 329-30252, 321-46045). The compounds of formula (2) may be produced, for example, according to the method described in J. Am. Chem. Soc. 124, 41, p. 12118 (2002).

Preferably, the azo dye compound of the invention is used as magenta of three primary colors.

The maximum absorption wavelength of the azo dye compound of the invention is preferably within a range of from 480 to 580 nm, more preferably within a range of from 510 to 540 nm.

[Coloring Composition]

The coloring composition of the invention is characterized by containing a dye of formula (1) of the invention. The coloring composition in this description is meant to include an ink sheet for thermal transfer recording, an inkjet ink, a color toner, a color filter, a writing pen, a coloring plastic, and other inks. The coloring composition of the invention is especially effective for an ink sheet for thermal transfer recording, an inkjet ink, a color toner, and a color filter.

[Ink Sheet for Thermal Transfer Recording]

The ink sheet for thermal transfer recording of the invention is characterized by containing a dye compound of formula (1). The ink sheet for thermal transfer recording generally has a structure that comprises a dye-donating layer formed on a support, in which the dye-donating layer contains a dye compound of formula (1). The ink sheet for thermal transfer recording of the invention may be produced by dissolving a dye compound of formula (1) in a solvent along with a binder or dispersing it in a solvent as fine particles thereby to prepare an ink, then applying the ink onto a support, and suitably drying it to thereby form thereon a dye-donating layer.

For the support of the ink sheet for thermal transfer recording of the invention, suitably employed is any one heretofore used as a support for ink sheets. For example, the materials described in JP-A-7-137466, paragraph [0050] are preferably used. The thickness of the support is preferably from 2 to 30 μm.

Not specifically defined in point of its type, the binder resin usable in the dye-donating layer of the ink sheet for thermal transfer recording of the invention may be any one which is highly resistant to heat and which does not interfere with the transfer of the dye compound into an image-receiving material under heat. For example, those described in JP-A-7-137466, paragraph [0049] are preferred examples for use herein. The solvent for formation of the dye-donating layer may be any known solvent heretofore used in the art. For example, those described in Examples in JP-A-7-137466 may be favorably used herein.

The content of the dye compound of formula (1) in the dye-donating layer is preferably from 0.03 to 1.0 g/m$^2$, more preferably from 0.1 to 0.6 g/m$^2$. The thickness of the dye-donating layer is preferably from 0.2 to 5 μm, more preferably from 0.4 to 2 μm.

Within a range not too much detracting from the effect of the invention, the ink sheet for thermal transfer recording of the invention may have any other layer than the dye-donating layer. For example, it may have an interlayer between the support and the dye-donating layer, and may have a back layer on the surface opposite to the support surface (this is hereinafter referred to as "back"). The interlayer includes, for example, an undercoat layer, and a diffusion-preventive layer for preventing dye diffusion toward the support (hydrophilic barrier layer). The back layer is, for example, a heat-resistant lubricant layer, which is for preventing the ink sheet from sticking to thermal head.

For applying the invention to a thermal transfer recording material for full color images, it is desirable that a cyan ink sheet containing a thermal diffusive cyan dye capable of forming a cyan image, a magenta ink sheet containing a thermal diffusive magenta dye capable of forming a magenta image and an yellow ink sheet containing a thermal diffusive yellow dye capable of forming an yellow image are formed in order on a support. If desired, an ink sheet containing a black image-firming substance may be further formed thereon.

For the cyan ink sheet containing a thermal diffusive cyan dye capable of forming a cyan image, for example, those described in JP-A-3-103477 and JP-A-3-150194 may be preferably used. For the yellow ink sheet containing a thermal diffusive yellow dye capable of forming an yellow image, for example, those described in JP-A-1-225592 may be preferably used.

[Thermal Transfer Recording]

In thermal transfer recording with the ink sheet for thermal transfer recording of the invention, the ink sheet may be combined with a heating means such as a thermal head and an image-receiving material. Specifically, heat energy is given to the ink sheet according to an image recording signal, and the dye in the part to which the heat energy has been given is transferred and fixed on an image-receiving material for image recording thereon. The image-receiving material generally has a structure that comprises a polymer-containing ink-receiving layer formed on a support. Regarding the constitution and the material of the image-receiving material, for example, preferred for use herein are those described in JP-A-7-137466, paragraphs [0056] to [0074].

[Color Toner]

The color toner of the invention is characterized by containing a dye compound of formula (1) of the invention. For the binder resin for the color toner into which a dye compound of formula (1) of the invention (preferably an azo dye compound) is introduced, usable is any and every binder generally used in toner. For example, the binder resin includes a styrene resin, an acryl resin, a styrene/acryl resin, a polyester resin. For the purpose of improving the flowability of the toner and for electrostatic control thereof, an inorganic powder and organic particles may be added to the toner as external additives. Preferably used are silica particles and titania particles surface-treated with an alkyl group-having coupling agent. Preferably, the particles have a number-average primary particle size of from 10 to 500 nm, and are added to the toner in an amount of from 0.1 to 20% by mass.

Any and every lubricant generally used in toner may also be used herein. Concretely, it includes olefins such as low-molecular-weight polypropylene, low-molecular-weight polyethylene, ethylene-propylene copolymer; and microcrystalline wax, carnauba wax, Sasol wax, paraffin wax. Its content in the toner is preferably from 1 to 5% by mass.

A charge controller may be optionally added to the toner of the invention, and it is preferably colorless from the viewpoint of the colorability of the toner. For example, it includes quaternary ammonium structure-having compounds and calixarene structure-having compounds.

The carrier may be any of a non-coated carrier which is composed of only magnetic material particles of iron, ferrite or the like; or a resin-coated carrier in which the surfaces of the magnetic material particles are coated with a resin. The mean particle size of the carrier is preferably from 30 to 150 µm as a volume-average particle size thereof.

Not specifically defined, the image formation method to which the toner of the invention is applied includes, for example, a method comprising repeatedly forming a color image on a photoreceptor and then transferring them onto an image-forming material for color image formation thereon, and a method comprising transferring the image formed on a photoreceptor onto an intermediate transfer medium one by one thereby forming a color image on the intermediate transfer medium, and then further transferring it onto an image-forming member such as paper for color image formation thereon.

[Inkjet Ink]

The inkjet ink of the invention is characterized by containing a dye compound of formula (1). The ink of the invention may be produced by dissolving and/or dispersing a dye compound of formula (1) in an oleophilic medium or an aqueous medium, preferably in an aqueous medium. As so mentioned hereinabove, the ink of the invention contains a dye having an excellent spectral characteristic and excellent fastness, and is therefore favorable for inkjet recording. If desired, any other additive may be added to the ink, not detracting from the effect of the invention. The other additives may be known additives, including, for example, a drying inhibitor (a wetting agent), an antifading agent, an emulsion stabilizer, a penetration promoter, a UV absorbent, a preservative, an antifungal agent, a pH regulator, a surface tension regulator, a defoaming agent, a viscosity regulator, a dispersant, a dispersion stabilizer, a rust inhibitor, a chelating agent. Generally, these various additives may be added to the dye dispersion after its production, but may be added to the oily phase or aqueous phase during its production.

The drying inhibitor is favorably used for the purpose of preventing the inkjet orifice of the nozzle in an inkjet recording system from being clogged by the inkjet ink dried at the orifice.

The drying inhibitor is preferably a water-soluble organic solvent having a lower vapor pressure than water. Its concrete examples are polyalcohols such as typically ethylene glycol, propylene glycol, diethylene glycol, polyethylene glycol, thiodiglycol, dithiodiglycol, 2-methyl-1,3-propanediol, 1,2, 6-hexanetriol, acetylene glycol derivatives, glycerin, trimethylolpropane; lower alkyl ethers of polyalcohols such as ethylene glycol monomethyl (or ethyl)ether, diethylene glycol monomethyl (or ethyl)ether, triethylene glycol monoethyl (or butyl)ether; heterocyclic compounds such as 2-pyrrolidone, N-methyl-2-pyrrolidone, 1,3-dimethyl-2-imidazolidinone, N-ethylmorpholine; sulfur-containing compounds such as sulforane, dimethyl sulfoxide, 3-sulforene; polyfunctional compounds such as diacetone alcohol, diethanolamine; and urea compounds. Of those, more preferred are polyalcohols such as glycerin, diethylene glycol. Those drying inhibitors may be used either singly or as in combination of two or more kinds. Preferably, the content of the drying inhibitor in the ink is from 10 to 50% by mass.

The above penetration promoter is favorably used for the purpose of more rapidly penetrating the inkjet ink into paper. The penetration promoter includes alcohols such as ethanol, isopropanol, butanol, di(tri)ethylene glycol monobutyl ether, 1,2-hexanediol; and nonionic surfactants such as sodium laurylsulfate, sodium oleate. When its amount is from 5 to 30% by mass in the ink, the promoter may fully exhibit its effect; and preferably, its content is enough for preventing print blur and print-through.

The UV absorbent is used for the purpose of improving image storability. The UV absorbent includes benzotriazole compounds described in JP-A-58-185677, JP-A-61-190537, JP-A-2-782, JP-A-5-197075, JP-A-9-34057; benzophenone compounds described in JP-A-46-2784, JP-A-5-194483, U.S. Pat. No. 3,214,463; cinnamic acid compounds described in JP-B-48-30492, JP-B-56-21141, JP-A-10-88106; triazine compounds described in JP-A-4-298503, JP-A-8-53427, JP-A-8-239368, JP-A-10-182621, JP-T-8-501291; compounds capable of absorbing UV rays to emit fluorescence, so-called fluorescent whiteners such as typically the compounds described in Research Disclosure No. 24239, and stilbene compounds, benzoxazole compounds.

The antifading agent is used for the purpose of improving image storability. The antifading agent may be various types of organic and metal complex antifading agents. The organic antifading agents include hydroquinones, alkoxyphenols, dialkoxyphenols, phenols, anilines, amines, indanes, chromans, alkoxyanilines, heterocyclic compounds; and the metal complexes include nickel complexes, zinc complexes. More concretely, herein usable are the compounds described in the patent references cited in Research Disclosure No. 17643, VII-I to J, No. 15162, No. 18716, left column on page 650, No. 36544, page 527, No. 307105, page 872, and No. 15162; as well as the compounds falling within the scope of the formula of the typical compounds and the examples of the compounds described in JP-A-62-215272, pp. 127-137.

The antifungal agent includes sodium dehydroacetate, sodium benzoate, sodium pyridinethione-1-oxide, ethyl p-hydroxybenzoate, 1,2-benzisothiazolin-3-one and its salts. Preferably, its content in the ink is from 0.02 to 1.00% by mass.

The pH regulator may be the above-mentioned neutralizing agent (organic base, inorganic alkali). Preferably, the pH regulator is added to the inkjet ink for the purpose of improving the storage stability of the ink, and is so added thereto that the ink may have a pH of from 6 to 10, more preferably from 7 to 10.

The surface tension regulator includes nonionic, cationic or anionic surfactants. Preferably, the surface tension of the inkjet ink that contains the coloring composition of the invention is from 20 to 60 mN/m, more preferably from 25 to 45 mN/m. Preferably, the viscosity of the inkjet ink of the invention is controlled to be at most 30 mPa·s, more preferably at most 20 mPa·s.

Preferred examples of the surfactant are anionic surfactants such as fatty acid salts, alkylsulfate ester salts, alkylbenzenesulfonate salts, alkylnaphthalenesulfonate salts, dialkylsulfosuccinate salts, alkylphosphate ester salts, naphthalenesulfonic acid/formalin condensates, polyoxyethylene alkylsulfate ester salts; and nonionic surfactants such as polyoxyethylene alkyl ethers, polyoxyethylene alkylallyl ethers, polyoxyethylene fatty acid esters, sorbitan fatty acid esters, polyoxyethylene sorbitan fatty acid esters, polyoxyethylene alkylamines, glycerin fatty acid esters, oxyethylene-oxypropylene block copolymers. In addition, acetylene-type polyoxyethylene oxide surfactants, Surfynols (trade name by Air Products & Chemicals) are also preferably used herein. Further, amine oxide-type ampholytic surfactants such as N,N-dimethyl-N-alkylamine oxides are also preferred. In addition, the surfactants described in JP-A-59-157636, pp. 37-38, Research Disclosure No. 308119 (1989) may also be used.

The defoaming agent may optionally used herein, including fluorine compounds, silicone compounds, and chelating agents such as EDTA.

In case where the dye compound of formula (1) is dispersed in an aqueous medium, it is desirable that coloring particles that contain the compound and an oil-soluble polymer are dispersed in an aqueous medium, as in JP-A-11-286637, JP-A-2001-240763, JP-A-2001-262039, JP-A-2001-247788; or the dye compound of formula (1) dissolved in a high-boiling-point organic solvent is dispersed in an aqueous medium, as in JP-A-2001-262018, JP-A-2001-240763, JP-A-2001-335734, JP-A-2002-80772. Regarding the concrete method for dispersing the dye compound of formula (1) in an aqueous medium, the oil-soluble polymer, the high-boiling-point organic solvent and the additive to be used, and their amount, those described in the above-mentioned patent references are preferably referred to. As the case may be, the solid bisazo compound may be directly dispersed as particles. In dispersing it, a dispersant or a surfactant may be used.

The dispersing device may be a simple stirrer, an impeller-type stirrer, an in-line stirrer, a mill (e.g., colloid mill, ball mill, sand mill, attritor, roll mill, agitator mill), an ultrasonic stirrer, or a high-pressure emulsifying disperser (high-pressure homogenizer—concretely, its commercially-available devices are Gaulin homogenizer, microfluidizer, DeBEE 2000 (by BEE International)). The method for producing the inkjet-recording ink is described in detail also in JP-A-5-148436, JP-A-5-295312, JP-A-7-97541, JP-A-7-82515, JP-A-7-118584, JP-A-11-286637, JP-A-2001-271003, apart from the above-mentioned patent references; and the descriptions may be referred to in producing the inkjet-recording ink of the invention.

The aqueous medium may be a mixture comprising water as a main ingredient thereof, and optionally containing a water-miscible organic solvent. Examples of the water-miscible organic solvent are alcohols (e.g., methanol, ethanol, n-propanol, isopropanol, butanol, isobutanol, sec-butanol, t-butanol, pentanol, hexanol, cyclohexanol, benzyl alcohol), polyalcohols (e.g., ethylene glycol, diethylene glycol, triethylene glycol, polyethylene glycol, propylene glycol, dipropylene glycol, polypropylene glycol, butylene glycol, hexanediol, pentanediol, glycerin, hexanetriol, thiodiglycol), glycol derivatives (e.g., ethylene glycol monomethyl ether, ethylene glycol monoethyl ether, ethylene glycol monobutyl ether, diethylene glycol monomethyl ether, diethylene glycol monobutyl ether, propylene glycol monomethyl ether, propylene glycol monobutyl ether, dipropylene glycol monomethyl ether, triethylene glycol monomethyl ether, ethylene glycol diacetate, ethylene glycol monomethyl ether acetate, triethylene glycol monomethyl ether, triethylene glycol monoethyl ether, ethylene glycol monophenyl ether), amines (e.g., ethanolamine, diethanolamine, triethanolamine, N-methyldiethanolamine, N-ethyldiethanolamine, morpholine, N-ethylmorpholine, ethylenediamine, diethylenetriamine, triethylenetetramine, polyethyleneimine, tetramethylpropylenediamine), and other polar solvents (e.g., formamide, N,N-dimethylformamide, N,N-dimethylacetamide, dimethylsulfoxide, sulforane, 2-pyrrolidone, N-methyl-2-pyrrolidone, N-vinyl-2-pyrrolidone, 2-oxazolidone, 1,3-dimethyl-2-imidazolidinone, acetonitrile, acetone). Two or more of the above-mentioned water-miscible organic solvents may be used herein as combined.

[Color Filter]

The color filter of the invention is characterized by containing a dye compound of formula (1). For producing the color filter, herein employable is a method that comprises first forming a pattern with a photoresist and then coloring it; or a method that comprises forming a pattern with a photoresist containing a coloring agent added thereto, as in JP-A-4-163552, JP-A-4-128703, JP-A-4-175753. For introducing the dye compound of formula (1) of the invention into a color filter, any of these methods may be employed. Preferred is the method described in JP-A-4-175753 or JP-A-6-35182, or that is, a method of color filter formation that comprises applying a positive resist composition containing a thermosetting resin, a quinonediazide compound, a crosslinking agent, a coloring agent and a solvent onto a support, exposing it through a mask, and developing the exposed part to form a positive resist pattern, then exposing the entire surface of the positive resist pattern, and thereafter curing the exposed positive resist pattern. Apart form the above, a black matrix may be formed according to an ordinary method, thereby producing an RGB primary color-type or YMC complementary color-type color filter.

Regarding the thermosetting resin, the quinonediazide compound, the crosslinking agent and the solvent and their amount, these described in the above-mentioned patent references may be preferably referred to.

EXAMPLES

The characteristics of the invention are described more concretely with reference to the following Production Examples and Examples, in which the material used, its amount and the ratio, the details of the treatment and the treatment process may be suitably modified or changed not overstepping the spirit and the scope of the invention. Accordingly, the invention should not be limitatively interpreted by the Examples mentioned below.

Example 1

Production and Evaluation of Dye Compounds

<Production of Compound (1)>

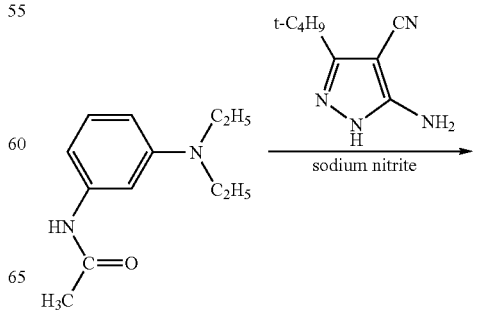

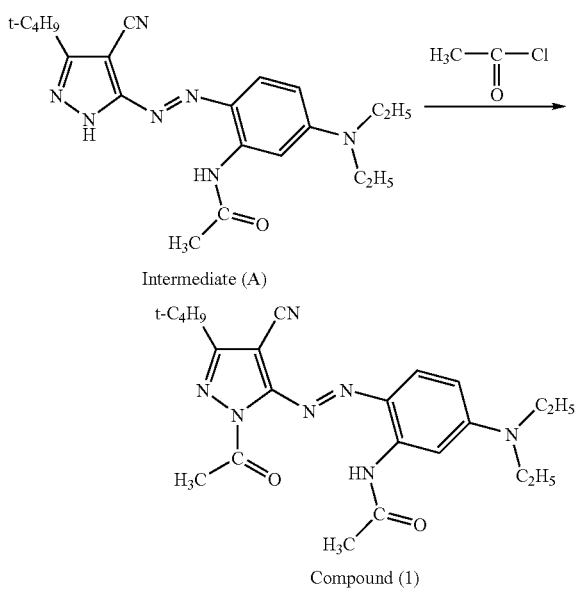

Intermediate (A)

Compound (1)

(Production of Intermediate (A))

5-Amino-3-tert-butyl-1H-pyrazole-4-carbonitrile (19.9 g, 0.121 mol) was dissolved in acetic acid (25 mL), propionic acid (35 mL) and concentrated hydrochloric acid (36 mL), and cooled to have an inner temperature of 0° C. A solution of sodium nitrite (8.8 g) dissolved in water (18 mL) was gradually dropwise added to it with its inner temperature kept not higher than 5° C., and after the addition, this was stirred at an inner temperature of from 0 to 5° C. for 30 minutes (diazo liquid). Apart from it, 3'-(diethylamino)acetanilide (25 g) was dissolved in acetonitrile (800 mL), and cooled to have an inner temperature of not higher than 10° C.; and the previously prepared diazo liquid was gradually added thereto. This was stirred at an inner temperature of not higher than 10° C. for 1 hour and then at room temperature for 1 hour; then the deposited crystal was taken out through filtration and washed with acetonitrile to obtain an yellow crystal of the intermediate (A) (yield: 38.4 g, 83.2%).

(Production of Compound (1))

The intermediate (A) (5.7 g, 0.015 mol), N,N-dimethylacetamide (30 mL), acetonitrile (30 mL) and triethylamine (2.2 mL) were mixed, cooled to have an inner temperature of not higher than 5° C., then acetyl chloride (1.6 mL) was dropwise added thereto still at the inner temperature of not higher than 10° C., and thereafter stirred at room temperature for 1 hour. The reaction liquid was poured into water, extracted with ethyl acetate, the ethyl acetate layer was washed with saturated saline water, and the ethyl acetate layer was concentrated with a rotary evaporator. Acetonitrile was added to the resulting residue, and the deposited crystal was taken out through filtration to obtain an yellow powder of Compound (1) (yield: 3.1 g, 49%; m.p. 151-153° C.). λmax (ethyl acetate solution) of Compound (1) was 539 nm.

<Production of Compounds (2) to (4)>

Compounds (2) to (4) were produced according to the above-mentioned Production Example. From the chemical viewpoint thereof, the other compounds than Compounds (1) to (4) can also be produced according to the above-mentioned methods of Production Example.

<Evaluation>

The thus-obtained Compounds (1) to (4) were analyzed for the maximum absorption wavelength of the absorption spectrum in an ethyl acetate solution (concentration, $1\times10^{-6}$ mol/L; optical path length, 10 mm), the melting point, the chemical shifts in the $^1$H-NMR spectrum (300 MHz, heavy chloroform solution), and the parent peak in the MS spectrum (MALDI-TOF-MS, using α-cyanocinnamic acid as the matrix), and their data are shown in Table 1 below.

TABLE 1

| Dye | Maximum Absorption Wavelength (nm) | Melting Point (° C.) | $^1$H-NMR (ppm) | MS |
|---|---|---|---|---|
| (1) | 539 | 151-153 | 1.3(6H), 1.5(9H), 2.3(3H), 2.8(3H), 3.6(4H), 6.5(1H), 7.9(1H), 8.2(1H), 9.2(1H) | 424 (M + 1)$^+$ |
| (2) | 542 | 166-167 | 1.3(6H), 1.5(9H), 2.3(3H), 3.5(4H), 6.3(1H), 7.3-7.7(3H), 8.0(2H), 8.1(1H), 9.2(1H) | 487 (M + 1)$^+$ |
| (3) | 539 | 195-196 | 1.3(6H), 1.5(9H), 2.3(3H), 3.5(4H), 4.1(3H), 6.5(1H), 7.9(1H), 8.2(1H), 9.2(1H) | 441 (M + 1)$^+$ |
| (4) | 521 | 128-131 | 1.3(6H), 1.5(9H), 2.3(3H), 2.9(3H), 3.2(3H), 3.5(4H), 6.4(1H), 7.8(2H), 8.2(1H), 9.0-9.5(1H) | 487 (M + 1)$^+$ |

Example 2

Formation and Evaluation of Ink Sheets for Thermal Transfer Recording

<Formation of Ink Sheets for Thermal Transfer Recording>

A polyester film (Lumirror, Toray's trade name) having a thickness of 6.0 μm and coated with a thermoplastic acrylic resin (thickness, 1 μm) for heat-resistant lubrication on the back thereof was used as a support. The following coating composition for dye-donating layer formation was applied onto the surface of the support film, in a mode of wire bar coating, thereby forming a coating layer having a dry thickness of 1 μm thereon to give an ink sheet 1.

| (Coating Composition for Dye-donating Layer Formation) | |
|---|---|
| Compound (1) | 5.5 mass pts. |
| Polyvinylbutyral resin (Eslec BX-1, Sekisui Chemical Industry's trade name) | 4.5 mass pts. |
| Methyl ethyl ketone/toluene (1/1) | 90 mass pts. |

Next, ink sheets 2 to 4 of the invention and comparative ink sheets 5 to 7 were formed in the same manner as that for the ink sheet 1 but using the dye shown in Table 2 below in place of Compound (1). In this process, the dye solubility was evaluated in three ranks; A (soluble easily), B (soluble), C (soluble but hardly). The results are shown in Table 2.

<Formation of Image-Receiving Material>

Synthetic paper (Yupo FPG200, Yupo Corporation's trade name, thickness 200 μm) was used as a support. A coating composition for white interlayer formation and a coating composition for receiving layer formation both mentioned below were applied onto its one face in that order, using a bar coater. The coating amount was so designed that, after dried, the white interlayer could be 1.0 g/m² and the receiving layer could be 4.0 g/m². The two layers were dried each at 110° C. for 30 seconds.

| (Coating Composition for White Interlayer Formation) | |
|---|---|
| Polyester resin (Vylon 200, Toyobo's trade name) | 10 mas. pts. |
| Fluorescent whitener (Uvitex OB, Ciba-Geigy's trade name) | 1 mas. pt. |
| Titanium oxide | 30 mas. pts. |
| Methyl ethyl ketone/toluene (1/1) | 90 mas. pts. |
| (Coating Composition for Receiving Layer Formation) | |
| Vinyl chloride-vinyl acetate resin (Solbin A, Nisshin Chemical Industry's trade name) | 100 mas. pts. |
| Amino-modified silicone (X22-3050C, Shin-etsu Chemical Industry's trade name) | 5 mas. pts. |
| Epoxy-modified silicone (X22-300E, Shin-etsu Chemical Industry's trade name) | 5 mas. pts. |
| Methyl ethyl ketone/toluene (1/1) | 400 mas. pts. |
| Benzotriazole UV absorbent (Tinuvin 900, Ciba Specialty Chemicals' trade name) | 5 mas. pts. |

("mas. pts." denotes parts by mass)

<Image Recording and Evaluation>

The ink sheet 1 and the image-receiving material produced in the manner as above were stuck together in such a manner that the dye-donating layer could face the image-receiving layer. This was tested for printing, using a thermal head applied to the back of the dye-donating material. The output of the thermal head was 0.25 W/dot, the pulse width thereof was from 0.15 to 15 msec, and the dot density was 6 dots/mm. Thus, a magenta dye was imagewise given to the image-receiving layer of the image-receiving material, and a sharp image was recorded thereon with no transfer unevenness. The ink sheets 2 to 8 were tested for image printing, in the same manner as that for the ink sheet 1.

The status A reflection density at the solid density (100% dot density) area of each of the thus-formed images was measured, and the samples were evaluated for the transferability in three ranks. Those having a reflection density of at least 1.8 are A (very good); those having a reflection density of from 1.6 to less than 1.8 are B (good); and those having a reflection density of from 1.0 to less than 1.6 are C (acceptable). The results are shown in Table 2 below.

Next, the recorded thermal transfer image-receiving materials were exposed to an Xe light (17000 lux) for 7 days and tested for the light stability (lightfastness) of the images. After the exposure, the status A reflection density of the part originally having a status A reflection density of 1.0 was measured, and the image stability was indicated by the density retentiveness ratio (percentage) to the original reflection density 1.0 before exposure. The samples were evaluated in three ranks, A (from 80% to less than 100%), B (from 60% to less than 80%), and C (less than 60%). The results are shown in Table 2 below.

TABLE 2

| Ink Sheet | Dye | Solubility | Transfer-ability | Light-fastness | Remarks |
|---|---|---|---|---|---|
| 1 | (1) | A | A | A | inventive sample |
| 2 | (2) | A | A | A | inventive sample |
| 3 | (3) | A | A | A | inventive sample |
| 4 | (4) | A | A | A | inventive sample |
| 5 | Comparative Dye 1 | B | A | C | comparative sample |
| 6 | Comparative Dye 2 | B | A | B | comparative sample |
| 7 | Comparative Dye 3 | B | B | C | comparative sample |

Comparative Dye 1 (similar to Dye 9 in U.S. Pat. No. 4,764,178):

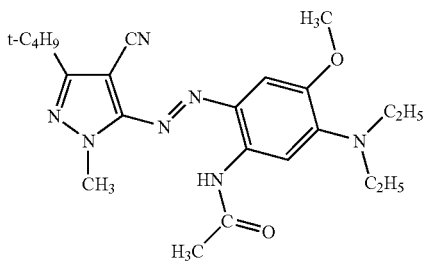

Comparative Dye 2 (similar to Dye 9 in U.S. Pat. No. 4,764,178):

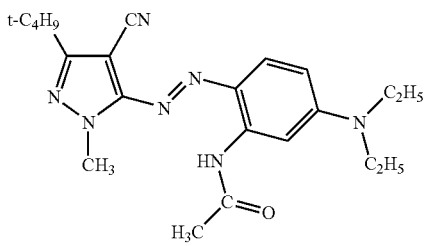

Comparative Dye 3 (Compound 1 in JP-A-4-265797):

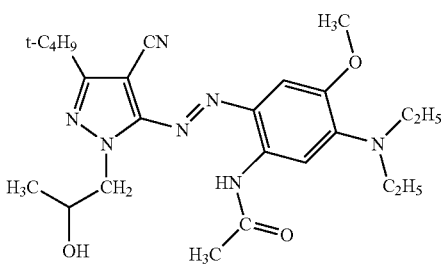

As a result of the above-mentioned image-recording tests, it is understood that the image transferred from the ink sheet, which comprises an azo dye compound of formula (1) of the invention, onto the image-receiving layer exhibits a vivid color, and as compared with the cases using the comparative dye, it has improved stability to light and has excellent image storability.

Surprisingly as compared with the comparative dyes, the azo dye compound of formula (1) of the invention has excellent solubility and therefore may greatly reduce the load for its dissolution in ink sheet production, and further, its transfer sensitivity is improved. It is therefore understood that the dye of the invention may solve the problems all at a time, which have heretofore been said to be difficult to solve.

Example 3

Formation and Evaluation of Color Toner

<Formation of Color Toner>

An azo dye compound of the invention (Compound (1), 3 parts by mass) and a toner resin (styrene-acrylate copolymer, Himer TB-1000F, Sanyo Chemical's trade name, 100 parts by mass) were mixed and ground in a ball mill, hot-melted by heating at 150° C. Then, after cooled, this was roughly ground with a hammer mill, and then finely ground with an air-jet grinder. Further, this was classified to select particles having a size of from 1 to 20 μm, to be a toner.

<Evaluation>

A carrier iron powder (EFV250/400, Nippon Teppun's trade name, 900 parts by mass) was uniformly mixed with the toner (10 parts by mass) to prepare a developing agent. The developing agent was tested in a dry-type normal paper electrophotographic copier [NP-5000, Canon's trade name], which confirmed that the agent has an excellent spectral characteristic and has excellent properties as toner.

Example 4

Formation and Evaluation of Inkjet Ink

<Formation of Inkjet Ink>

An azo dye compound of the invention (Compound (1), 5.63 g), and sodium dioctylsulfosuccinate (7.04 g) were dissolved in the following high-boiling-point organic solvent (S-2, 4.22 g), the following high-boiling-point organic solvent (S-11, 5.63 g) and ethyl acetate (50 ml) at 70° C. Deionized water (500 ml) was added to the solution with stirring with a magnetic stirrer to prepare an oil-in-water dispersion of rough particles.

Next, the rough dispersion was triturated by processing it in a microfluidizer (by Microfluidex Inc) under a pressure of 60 MPa repeatedly 5 times in all, and the resulting emulsion was processed in a rotary evaporator for solvent removal until it could give no odor of ethyl acetate.

To the thus-obtained fine emulsion of hydrophobic dye, added were diethylene glycol (140 g), glycerin (50 g), Surfynol 465 (Air Products & Chemicals' trade name, 7 g), and deionized water (900 ml) to prepare an inkjet ink.

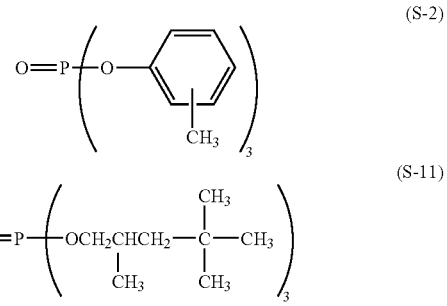

<Evaluation>

The thus-obtained ink was filled in a cartridge for an inkjet printer (PM-G800, Seiko Epson's trade name), in which this was tested for image recording on inkjet paper for color photography, Pro (Fuji Photo Film's trade name). The reflection spectrum of the obtained image is shown in FIG. 1. As is obvious from the data in FIG. 1, the obtained image has an excellent spectral characteristic, and the ink has excellent properties as an inkjet ink.

Example 5

Formation and Evaluation of Color Filter

<Formation of Color Filter>

(Preparation of Positive Resist Composition)

A cresol/novolak resin (polystyrene-based mass-average molecular weight, 4300; 3.4 parts by mass) obtained from a mixture of m-cresol/p-cresol/formaldehyde (reaction molar ratio=5/5/7.5), o-naphthoquinonediazide-5-sulfonate (two hydroxyl groups on average are esterified, 1.8 parts by mass) obtained from the following phenol compound, hexamethoxymethylolated melamine (0.8 parts by mass), ethyl lactate (20 parts by mass) and Compound (1) (1 part by mass) were mixed to prepare a positive resist composition.

Phenol Compound

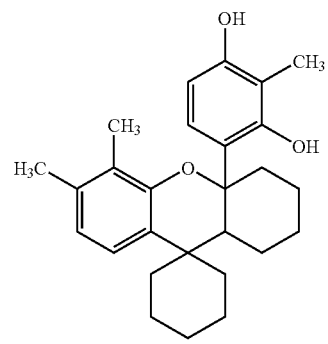

(Formation of Color Filter)

The obtained positive resist composition was applied onto a silicon wafer in a mode of spin coating, and the solvent was evaporated away. Next, the silicon wafer was exposed to light via a mask, thereby decomposing the quinonediazide compound. Next, this was heated at 100° C., and then the exposed part was removed through alkali development, thereby giving a positive color pattern at a resolution of 0.8 µm. This was exposed to light on its entire surface, and then heated at 150° C. for 15 minutes to obtain a color filter complementary to magenta. For the exposure, used was an i-ray exposure stepper, Hitachi LD-5010-i (Hitachi's trade name; NA=0.40). The developer was SOPD or SOPD-B (both trade names by Sumitomo Chemical Industry).

<Evaluation>

Figure 2:
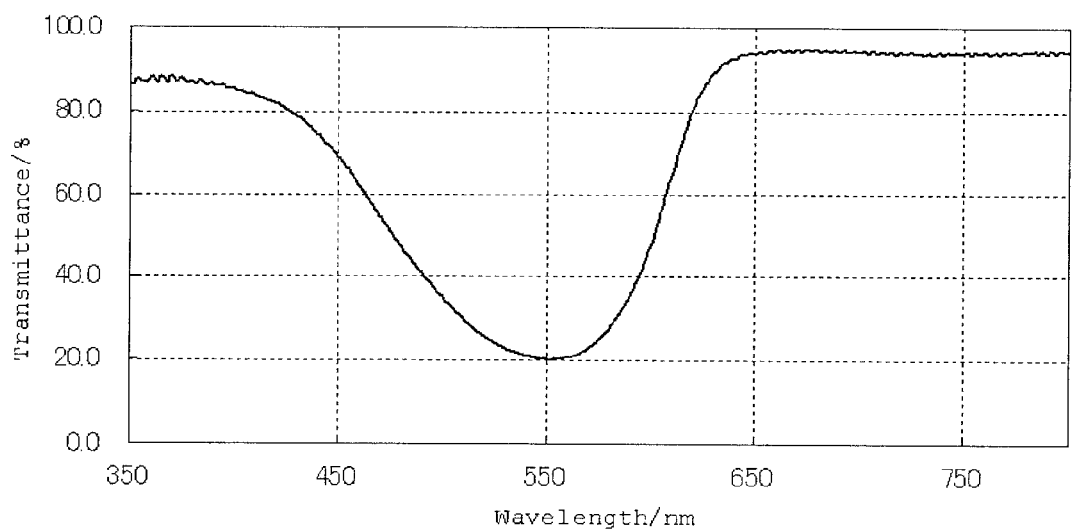
FIG. 2 is a transmission spectrum of the color filter produced in Example 5.

FIG. 2 shows the transmission spectrum of the obtained color filter. As is obvious from the data in FIG. 2, the obtained color filter has an excellent spectral characteristic and excellent light transmittance, and has excellent properties as color filter.

According to the invention, there are provided a novel azo dye compound having an excellent optical characteristic with sharp absorption and having excellent fastness and excellent solubility, and a coloring composition containing it. According to the invention, there are also provided an ink sheet for thermal transfer recording that satisfies all the requirements of excellent color reproducibility, image storability and transfer sensitivity in printing samples, and a thermal transfer recording method with it. The ink sheet is excellent as the working load and the environmental load in its formation are greatly reduced. Further, the invention also provides a color toner, an inkjet ink and a color filter containing the azo dye compound. Accordingly, the invention is expected to be effectively used in high-quality full-color recording, and its industrial applicability is great.

While the present invention has been described in detail and with reference to specific embodiments thereof, it will be apparent to one skilled in the art that various changes and modifications can be made therein without departing from the spirit and scope thereof.

The present disclosure relates to the subject matter contained in Japanese Patent Application No. 267097/2006 filed on Sep. 29, 2006, which is expressly incorporated herein by reference in its entirety. All the publications referred to in the present specification are also expressly incorporated herein by reference in their entirety.

The foregoing description of preferred embodiments of the invention has been presented for purposes of illustration and description, and is not intended to be exhaustive or to limit the invention to the precise form disclosed. The description was selected to best explain the principles of the invention and their practical application to enable others skilled in the art to best utilize the invention in various embodiments and various modifications as are suited to the particular use contemplated. It is intended that the scope of the invention not be limited by the specification, but be defined claims set forth below.

What is claimed is:

1. An azo dye represented by the following formula (1):

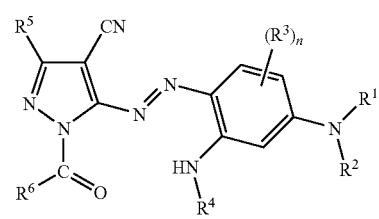

Formula (1)

wherein $R^1$, $R^2$, $R^4$ and $R^5$ each independently represent a hydrogen atom or a substituent; $R^3$ and $R^6$ each independently represent a substituent; n indicates an integer of from 0 to 3; when n is 2 or more, then plural $R^3$'s may be the same or different; $R^1$ and $R^2$ may bond to each other to form a ring structure.

2. A coloring composition comprising the azo dye compound of claim 1.

3. An ink sheet for thermal transfer recording, comprising the azo dye compound of claim 1.

4. A thermal transfer recording method comprising forming an image on an image-receiving material comprising a polymer-containing ink-receiving layer on a support by use of the ink sheet for thermal transfer recording of claim 3.

5. A color toner comprising the azo dye compound of claim 1.

6. An inkjet ink comprising the azo dye compound of claim 1.

7. A color filter comprising the azo dye compound of claim 1.

* * * * *